United States Patent
Yamasaki et al.

(10) Patent No.: US 6,486,068 B2
(45) Date of Patent: *Nov. 26, 2002

(54) METHOD FOR MANUFACTURING GROUP III NITRIDE COMPOUND SEMICONDUCTOR LASER DIODES

(75) Inventors: Shiro Yamasaki, Aichi-ken (JP); Seiji Nagai, Acihi-ken (JP); Masayoshi Koike, Aichi-ken (JP); Isamu Akasaki, 1-1-38-805, Joshin, Nishi-ku, Nagoya-shi, Aichi-ken, 451 (JP); Hiroshi Amano, 2-104, Yamanote, Meito-ku, Nagoya-shi, Aichi-ken, 465 (JP); Isao Yamada, 6-11-9, Shinzaike Honcho, Himeji-shi, Hyogo-ken, 670 (JP); Jiro Matsuo, 144, Fushimi-godoshukusha, Higashibugyo-cho, Fushimi-ku, Kyoto-shi, Kyoto-fu, 612 (JP)

(73) Assignees: Toyoda Gosei Co., Ltd., Aichi-ken (JP); Isamu Akasaki, Nagoya (JP); Hiroshi Amano, Nagoya (JP); Japan Science and Technology, Kawaguchi (JP); Isao Yamada, Himeji (JP); Jiro Matsuo, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/004,608

(22) Filed: Jan. 8, 1998

(65) Prior Publication Data

US 2002/0006726 A1 Jan. 17, 2002

(51) Int. Cl.[7] ............................................. H01L 21/302
(52) U.S. Cl. ...................... 438/706; 438/710; 438/712; 438/720
(58) Field of Search .......................... 438/46, 700, 702, 438/706, 710, 712, 711, 720, 22, 38, 694, 958

(56) References Cited

U.S. PATENT DOCUMENTS

| | | | |
|---|---|---|---|
| 4,563,368 A | * 1/1986 | Tihanyi et al. | 427/82 |
| 5,022,026 A | * 6/1991 | Suyama et al. | 372/45 |
| 5,022,036 A | * 6/1991 | Suyama et al. | 372/45 |
| 5,284,792 A | * 2/1994 | Forster et al. | 437/129 |
| 5,423,940 A | * 6/1995 | Chen et al. | 216/66 |
| 5,444,013 A | * 8/1995 | Akram et al. | 438/254 |
| 5,492,607 A | * 2/1996 | Yap | 204/192.34 |
| 5,512,331 A | * 4/1996 | Myyakuni | 427/528 |
| 5,624,529 A | * 4/1997 | Shul et al. | 438/718 |
| 5,642,373 A | * 6/1997 | Kamizato et al. | 372/50 |
| 5,814,533 A | * 9/1998 | Shakuda | 438/46 |
| 5,834,331 A | * 11/1998 | Razeghi | 438/40 |
| 5,874,747 A | * 2/1999 | Redwng et al. | 257/77 |
| 5,968,845 A | * 10/1999 | Chino et al. | 438/704 |

OTHER PUBLICATIONS

"A Solid Surface Processing By Using Gas Cluster Ion Beam", Applied Physics, vol. 66, No. 6, 1997, p559–568.

* cited by examiner

Primary Examiner—Benjamin L. Utech
Assistant Examiner—Lan Vinh
(74) Attorney, Agent, or Firm—Pillsbury Winthrop LLP

(57) ABSTRACT

A method for manufacturing a laser diode using Group III nitride compound semiconductor comprising a buffer layer 2, an n[+] layer 3, a cladding layer 4, an active layer 5, a p-type cladding layer 61, a contact layer 62, an $SiO_2$ layer 9, an electrode 7 which is formed on the window formed in a portion of the $SiO_2$ layer 9, and an electrode 8 which is formed on a portion of the n[+] layer 3 by etching a portion of 4 layers from the contact layer 62 down to the cladding layer 4. One pair of opposite facets S of a cavity is formed by RIBE, and then the facets are etched by gas cluster ion beam etching using Ar gas. As a result, the facets S are flatted and the mirror reflection of the facets S is improved.

15 Claims, 7 Drawing Sheets

METHOD FOR MANUFACTURING GROUP III NITRIDE COMPOUND SEMICONDUCTOR LASER DIODES

BACKGROUND OF THE INVENTION

1. Field of the invention

The present invention relates to a method for manufacturing a group III nitride compound semiconductor laser diode (hereinafter "LD"). In particular, the present invention relates to a method for manufacturing a facet of a cavity of an LD.

2. Description of the Related Art

A light-emitting diode (LED) and a laser diode (LD) which emit blue light have been known, which comprise layers of gallium nitride group compound semiconductor (AlGaInN) formed on a sapphire substrate. A verticality and a parallelism of one pair of opposite facets of a cavity should be kept high to reflect and oscillate lights of an LD effectively. Although a cleavage is the best way to form one pair of opposite facets which has high verticality and parallelism, it is difficult to cleave the facets of the LD because the substrate and the layers are made of different materials. Accordingly, dry etching is used to form the facets as an alternative method of the cleavage.

However, the facets of the cavity formed by dry etching is damaged by ion and has a magnitude of surface roughness of 200 Å. As a result, an optical reflectiveness of the facets is lowered and the oscillation threshold current density is heightened. In case that reflection films are formed on the facets of the cavity, the films cannot be formed accurately as designed because the facets of the cavity are rough. As a result, lights are scattered on the facets and the efficiency of confining emitted lights in an active layer is lowered.

SUMMARY OF THE INVENTION

It is therefore an object of the present invention to improve a mirror reflection of the one pair of opposite facets of a cavity of the LD, to improve the efficiency of confining lights by improving the optical reflectiveness, and to lower an oscillation threshold current density.

The present invention is related to a method for manufacturing a laser diode using Group III nitride compound semiconductor comprising the steps of forming layers comprising Group III nitride compound semiconductor on a substrate, dry-etching each of said layers to form one pair of opposite facets of a cavity, and further etching said dry-etched facets by gas cluster ion beam etching. As a result, the surface roughness of the facets of the cavity by dry etching is reduced by gas cluster ion beam etching, a mirror reflection of the facets is improved, the effect of confining lights between the opposite facets is increased, and an oscillation threshold current density of the LD is lowered.

A Group III nitride compound semiconductor should be preferably a material satisfies the formula $Al_xGa_yIn_{1-x-y}N$ ($0 \leq x \leq 1$, $0 \leq y \leq 1$, $0 \leq x+y \leq 1$) to obtain blue color short wave LD. When the semiconductor is formed by a cladding layer of $Ga_{x1}In_{1-x1}N$ ($0 \leq x1 \leq 1$) and an active layer of $Ga_{x2}In_{1-x2}N$ ($0 \leq x2 \leq 1$), output power of the blue color LD is improved. The facets are effectively formed by reactive ion beam etching (RIBE hereinafter) more than by dry etching. It is more preferable to use RIBE with $Cl_2$ gas, because a higher etching rate can be obtained. Further, a rough layer on the facets formed by dry etching is removed effectively by gas cluster ion beam etching, and a mirror reflection of the facets is improved. The mirror reflection of the facets is improved to form the facets by gas cluster ion beam etching using inert gases like argon (Ar), helium (He), neon (Ne), krypton (Kr), xenon (Xe), radon (Rn), nitrogen ($N_2$), and carbon dioxide ($CO_2$) or reactive gases like hydrogen chloride (HCl), chlorine ($Cl_2$), carbon chloride trifluoride ($CClF_3$), bromine (Br), and hydrogen bromide (HBr). Then a wafer treated by above-mentioned process is divided into peaces of strip parallel to the facets of the cavity. Each of the strips are disposed with the facets of the cavity facing upside, and the facet is etched by cluster beam etching to improve the efficiency of a mirror reflection of the facet.

DETAILED DESCRIPTION OF THE PREFERRED EMBODIMENT

The invention will be more fully understood by reference to the following embodiment, but not limited thereto.

Figure 1:
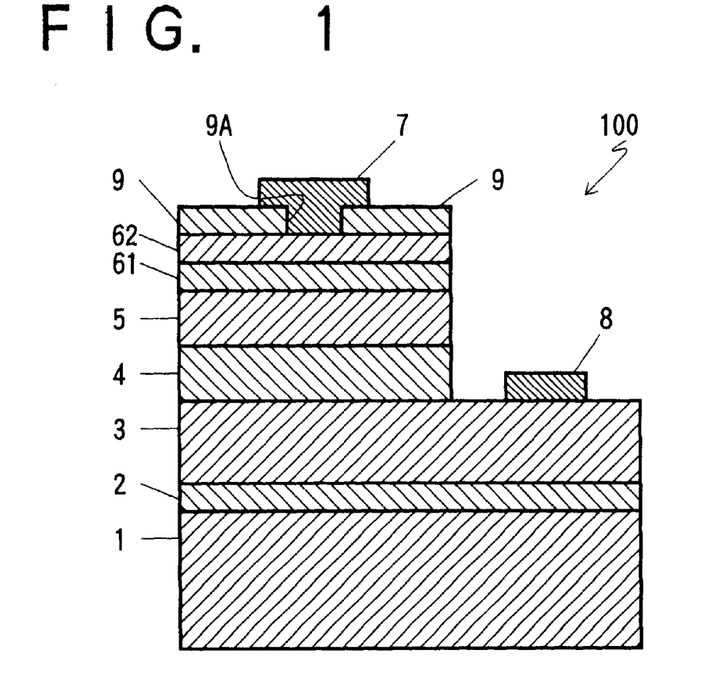
FIG. 1 is a constitutive view illustrating the structure of a laser diode in the example set forth below.

FIG. 1 shows a whole structure of an LD 100 in this embodiment. The LD 100 has a sapphire substrate 1 on which about 500 Å in thickness of aluminum nitride (AlN) buffer layer 2 is formed. Five semiconductor layers are consecutively formed on the buffer layer 2: about 2.2 $\mu$m in thickness of silicon (Si) doped gallium nitride (GaN) layer 3 of high carrier concentration ($n^+$-type), having an electron concentration of $2 \times 10^{18}/cm^3$ and Si concentration of $4 \times 10^{18}/cm^3$; about 1.0 $\mu$m in thickness of Si-doped n-$Al_{0.08}Ga_{0.92}N$ cladding layer 4 of n-type, having an electron concentration of $2 \times 10^{18}/cm^3$ and Si concentration of $4 \times 10^{18}/cm^3$; about 0.05 $\mu$m in thickness of $Ga_{0.92}In_{0.08}N$ active layer 5; about 1.0 $\mu$m in thickness of Mg-doped $Al_{0.08}Ga_{0.92}N$ cladding layer 61 of p-type, having a hole concentration of $5 \times 10^{17}/cm^3$ and Mg concentration of $1 \times 10^{20}/cm^3$; and about 0.2 $\mu$m in thickness of Mg-doped GaN contact layer 62, having a hole concentration of $7 \times 10^{17}/cm^3$ and Mg concentration of $2 \times 10^{20}/cm^3$. An insulating film of $SiO_2$ layer 9 is formed on the contact layer 62 and has a window through which electrode layer 7 including Ni was formed in contact with the contact layer 62. An Ni electrode layer 8 is formed on some portion of the $n^+$ layer 3 of high carrier concentration.

Figure 2:
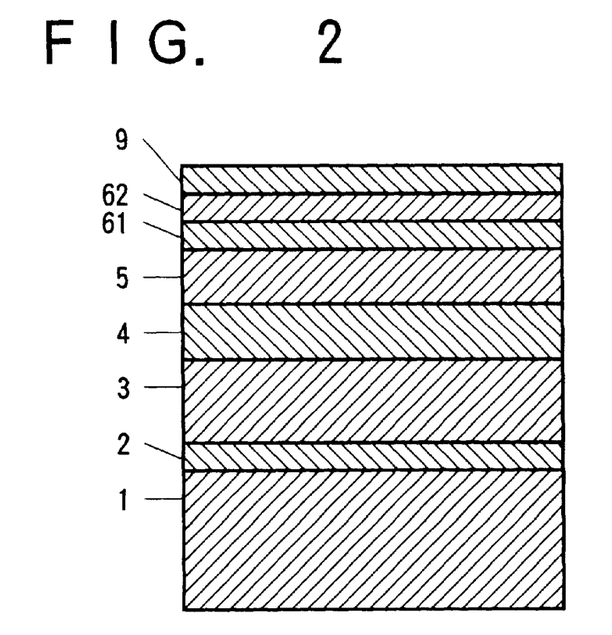
FIGS. 2 to 5 are sectional views illustrating successive steps of manufacturing the LD.

A method for manufacturing the LD 100 is explained hereinafter. Each of the semiconductor layers of the LD 100 was formed on the sapphire substrate 1 as shown in FIG. 2 by gaseous phase epitaxial growth, called metal organic vapor phase deposition (hereinafter MOVPE).

The gases employed in this process were ammonia ($NH_3$), a carrier gas ($H_2$ or $N_2$), trimethyl gallium ($Ga(CH_3)_3$) (hereinafter TMG), trimethyl aluminum ($Al(CH_3)_3$) (hereinafter TMA), trimethyl indium ($In(CH_3)_3$) (hereinafter TMI), silane ($SiH_4$), and biscyclopentadienyl magnesium ($Mg(C_5H_5)_2$) (hereinafter $CP_2Mg$).

About 100 μm to 400 μm in thickness of the single crystalline sapphire substrate 1 was placed on a susceptor in a reaction chamber for the MOVPE treatment after its main surface 'a' was cleaned by an organic washing solvent and heat treatment. Then the sapphire substrate 1 was gaseous phase etched at 1100° C. by $H_2$ vapor fed into the chamber at a flow rate of 2 liter/min. under normal pressure.

About 500 Å in thickness of AlN buffer layer 2 was formed on the surface 'a' of the baked sapphire substrate 1 under conditions controlled by lowering the temperature in the chamber to 400° C., keeping the temperature constant, and concurrently supplying $H_2$ at a flow rate of 20 liter/min., $NH_3$ at 10 liter/min., and TMA at $1.8 \times 10^{-5}$ mol/min.

About 2.2 μm in thickness of Si-doped GaN was formed on the buffer layer 2, as an n$^+$layer 3 of high carrier concentration with an Si concentration of about $4 \times 10^{18}/cm^3$ and an electron concentration of about $2 \times 10^{18}/cm^3$, under conditions controlled by keeping the temperature of the sapphire substrate 1 at 1150° C. and concurrently supplying for 30 min. $H_2$ at a flow rate of 20 liter/min., $NH_3$ at 10 liter/min., TMG at $1.7 \times 10^{-4}$ mol/min., and silane diluted to 0.86 ppm by $H_2$ at 200 ml/min.

About 1.0 μm in thickness of Si-doped $Al_{0.08}Ga_{0.92}N$ was formed on the n$^+$layer 3, as a cladding layer 4 of n-type with an electron concentration of about $2 \times 10^{18}/cm^3$ and Si concentration of about $4 \times 10^{18}/cm^3$, under conditions controlled by keeping the temperature of the sapphire substrate 1 at 1100° C. and concurrently supplying for 60 min. $N_2$ or $H_2$ at a flow rate of 10 liter/min., $NH_3$ at 10 liter/min., TMG at $1.12 \times 10^{-4}$ mol/min., TMA at $0.47 \times 10^{-4}$ mol/min., and silane diluted to 0.86 ppm by $H_2$ at $10 \times 10^{-9}$ mol/min.

About 0.05 μm in thickness of $Ga_{0.92}In_{0.08}N$ was formed on the cladding layer 4 as an active layer 5 under conditions controlled by keeping the temperature of the sapphire substrate 1 at 850° C. and concurrently supplying for 6 min. $N_2$ or $H_2$ at a flow rate of 20 liter/min., $NH_3$ at 10 liter/min., TMG at $1.53 \times 10^{-4}$ mol/min., and TMI at $0.02 \times 10^{31\ 4}$ mol/min.

About 1.0 μm in thickness of Mg-doped $Al_{0.08}Ga_{0.92}N$ of p-type, serving as a cladding layer 61 with an Mg concentration of about $1 \times 10^{20}/cm^3$, was formed on the active layer 5 under conditions controlled by keeping the temperature of the sapphire substrate 1 at 1100° C. and concurrently supplying for 60 min. $N_2$ or $H_2$ at a flow rate of 20 liter/min., $NH_3$ at 10 liter/min., TMG at $1.12 \times 10^{-4}$ mol/min., TMA at 0.47×10–4 mol/min., and $CP_2Mg$ at $2 \times 10^{-4}$ mol/min. At this stage, the resistivity of the cladding layer 61 was $10^8 \cdot \Omega cm$ or more, exhibiting insulating characteristics.

About 0.2 μm in thickness of Mg-doped GaN, serving as a contact layer 62, was formed on the cladding layer 61 with an Mg concentration of $2 \times 10^{20}/cm^3$ under conditions controlled by keeping the temperature of the sapphire substrate 1 at 1100° C. and concurrently supplying for 4 min. $N_2$ or $H_2$ at a flow rate of 20 liter/min., $NH_3$ at 10 liter/min., TMG at $1.12 \times 10^{31\ 4}$ mol/min, and $CP_2Mg$ at $4 \times 10^{-4}/cm^3$ mol/min. At this stage, the resistivity of the contact layer 62 was $10^8 \cdot \Omega cm$ or more, exhibiting insulating characteristics.

Then, electron rays were uniformly irradiated into the insulative two layers using a reflective electron beam diffraction device. The irradiation conditions were set at 10 kV for the accelerating voltage, 1 μA for the sample current, 0.2 mm/sec. for the speed of the beam scanning, 60 um for the beam aperture, and at $5.0 \times 10^5$ Torr vacuum. This irradiation changed the insulative two layers, or the contact layer 62 and the cladding layer 61, to each be a p-type conductive semiconductor with respective hole concentrations of $7 \times 10^{17}/cm^3$ and $5 \times 10^{17}/cm^3$, and respective resistivities of $2 \cdot \Omega cm$, and $0.8 \cdot \Omega cm$. As a result, a wafer with a multiple layer structure was obtained.

Figure 3:
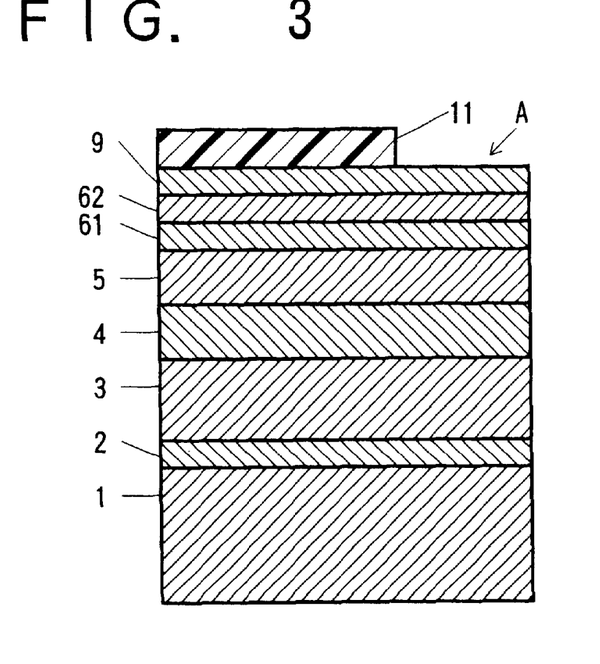

Then, electrodes 7 and 8 were formed as follows. About 2000 Å in thickness of $SiO_2$ layer 9 was formed on the contact layer 62 by sputtering as shown in FIG. 2. The $SiO_2$ layer 9 was laminated by a photoresist layer 11. An electrode forming part A for the electrode 8 in contact with the n$^+$ layer 3 of high carrier concentration was formed by removing some portion of the photoresist layer 11 on the contact layer 62 by patterning using photolithography as shown in FIG. 3. Then, the exposed portion of the $SiO_2$ layer 9 which was not covered by the photoresist was removed by hydrofluoric acid etchings liquid.

Figure 4:
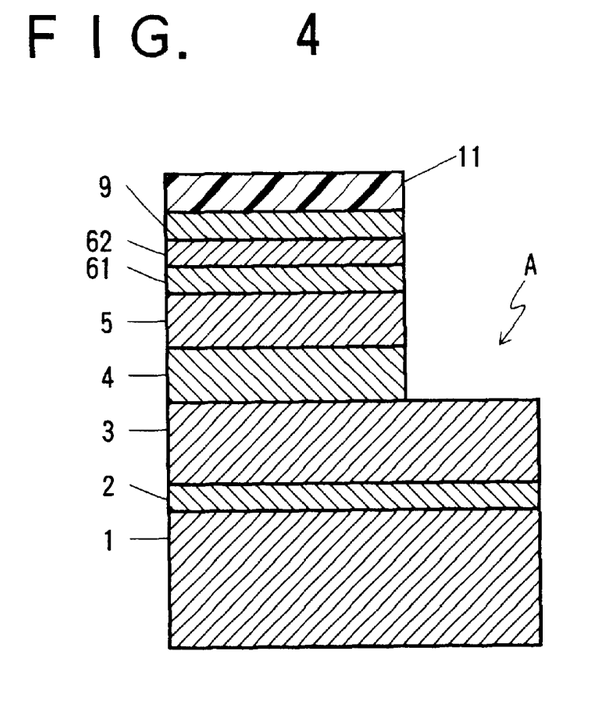

Then, the portion A of the layers which was not covered by the photoresist layer 11 and the $SiO_2$ layer 9, from the contact layer 62 down to the cladding layer 4, was removed by dry etching. The etching condition was set at 0.04 Torr vacuum and high frequency wave electric power of 0.44 W/cm$^3$, concurrently supplying $BCl_3$ gas at a flow rate of 10 mol/min. Then the portion A was dry-etched by argon (Ar). As a result, a recess A was formed to deposit an electrode on the n$^+$ layer 3 of high carrier concentration as shown in FIG. 4.

Figure 5:
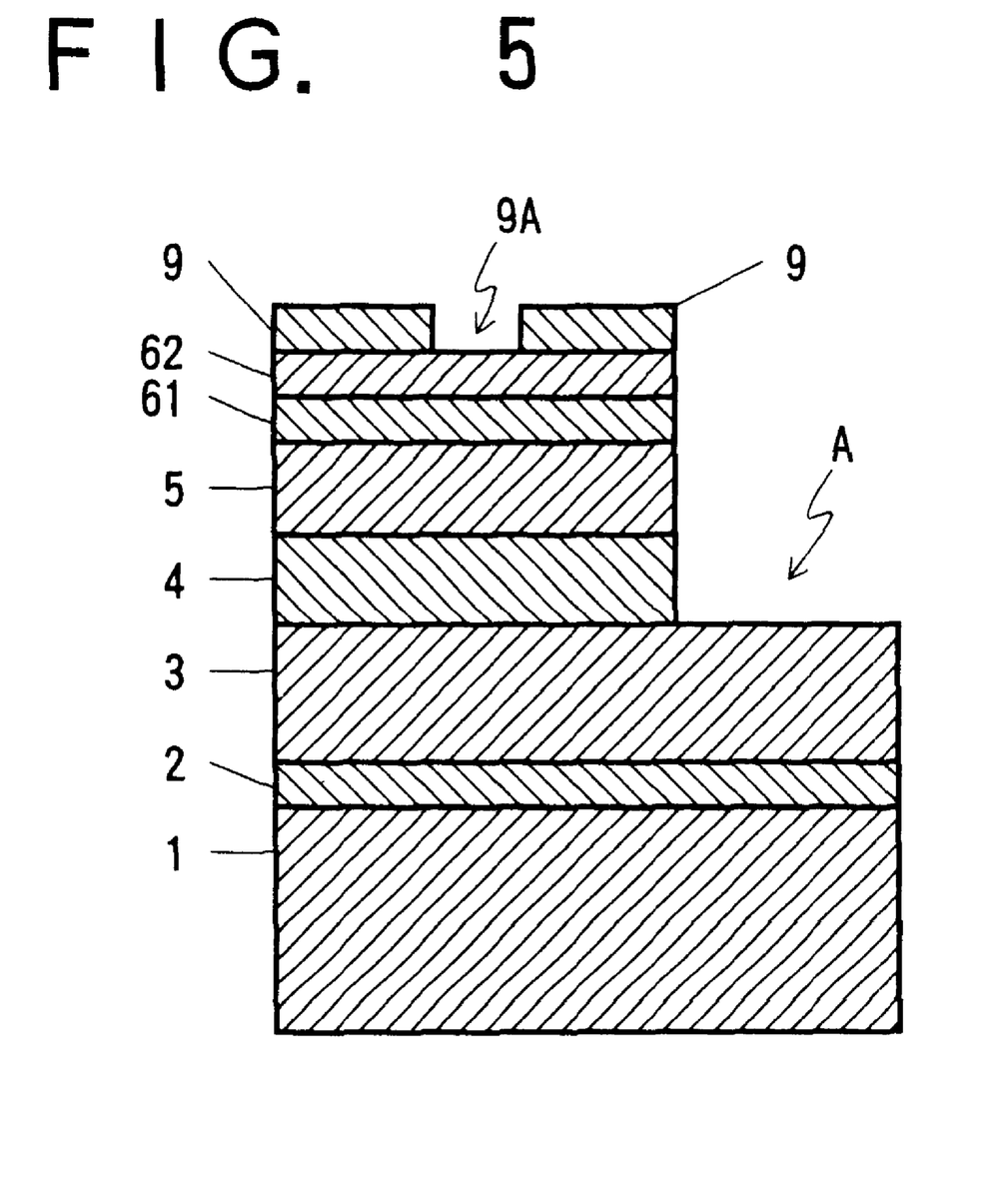

Through the process of laminating a photoresist layer, patterning by photolithography, and carrying out wet etching to $SiO_2$ layer 9, a window 9A was formed in the central portion of the $SiO_2$ layer 9, where an electrode was to be formed in contact with the contact layer 62 as shown in FIG. 5.

Figure 6:
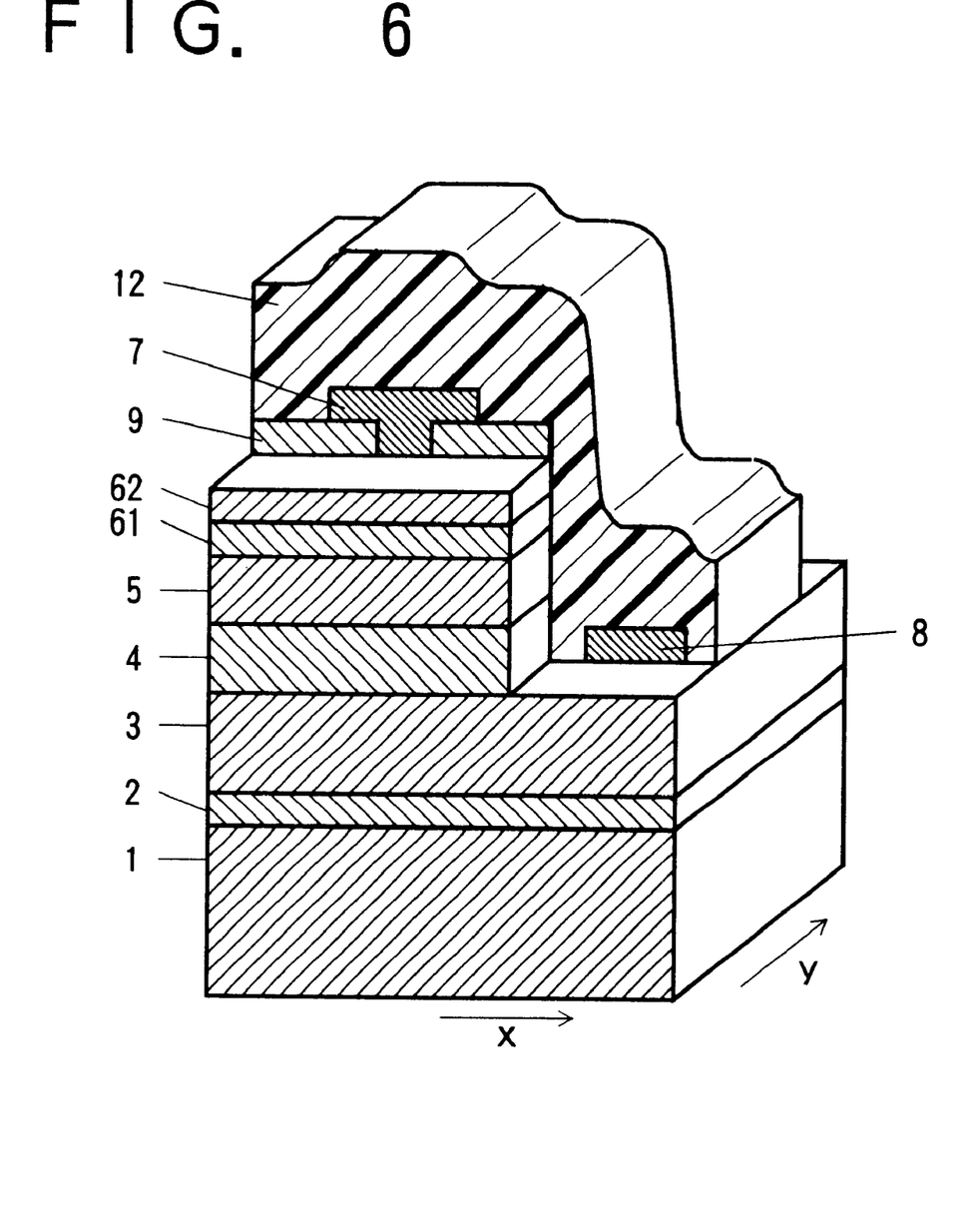
FIG. 6 is a perspective-sectional view illustrating a successive steps of manufacturing the LD.

Then, Ni was uniformly deposited on the wafer formed with the above-mentioned process. Through the process of laminating a photoresist layer, patterning by photolithography, and carrying out etching, the electrodes 8 and 7 were formed in contact with the n$^+$ layer 3 and the contact layer 62 of high carrier concentrations, respectively, as shown in FIG. 6.

Then, the one pair of opposite facets S of a cavity was formed as follows. A photoresist layer was laminated on the entire surface of the wafer. Then, through the process of patterning by photolithography, the photoresist layer on the wafer was left having width corresponding to the length of the cavity (the direction of axis y), and stripe-shaped windows were removed parallel to the direction of axis x. Then, the exposed portion or the $SiO_2$ layer 9 which was not covered by the photoresist was removed by hydrofluoric acid etching liquid. As shown in FIG. 6, a resist mask layer 12 and the $SiO_2$ layer 9 which covered the wafer parallel to the length of the cavity (the direction of axis x) were formed.

Then the window which was not covered by the $SiO_2$ layer 9 and the resist mask layer 12 was dry etched by reactive ion beam etching (RIBE) till the sapphire substrate 1 was exposed. The etching condition was set at 1 mTorr vacuum and high frequency wave electric power of 300 W, concurrently supplying $Cl_2$ gas at a flow rate of 5 ml/min.

Figure 8A:
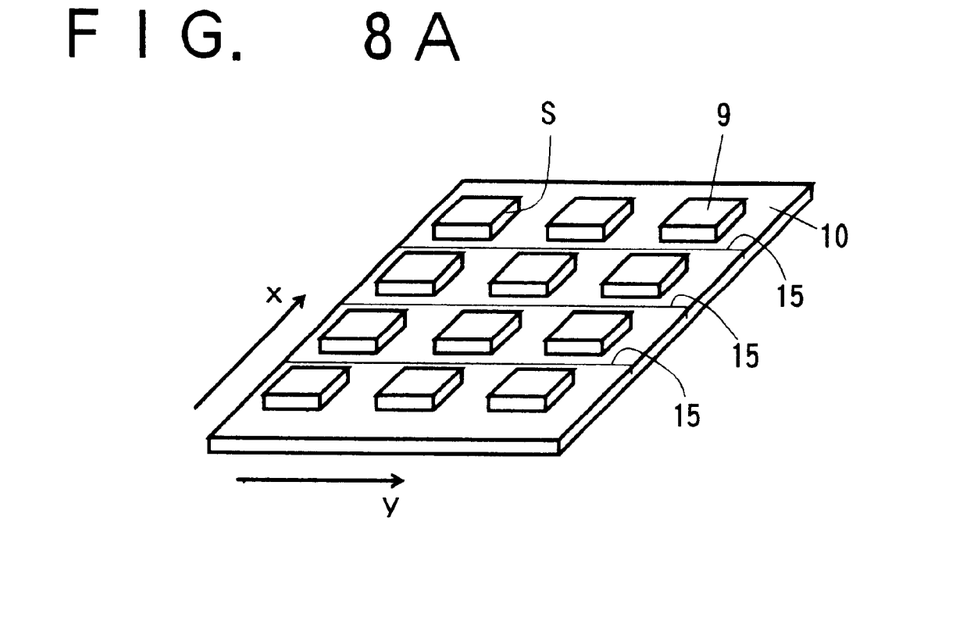
FIG. 8 is a view illustrating methods of cutting a wafer and a cluster beam etching.
Figure 8B:
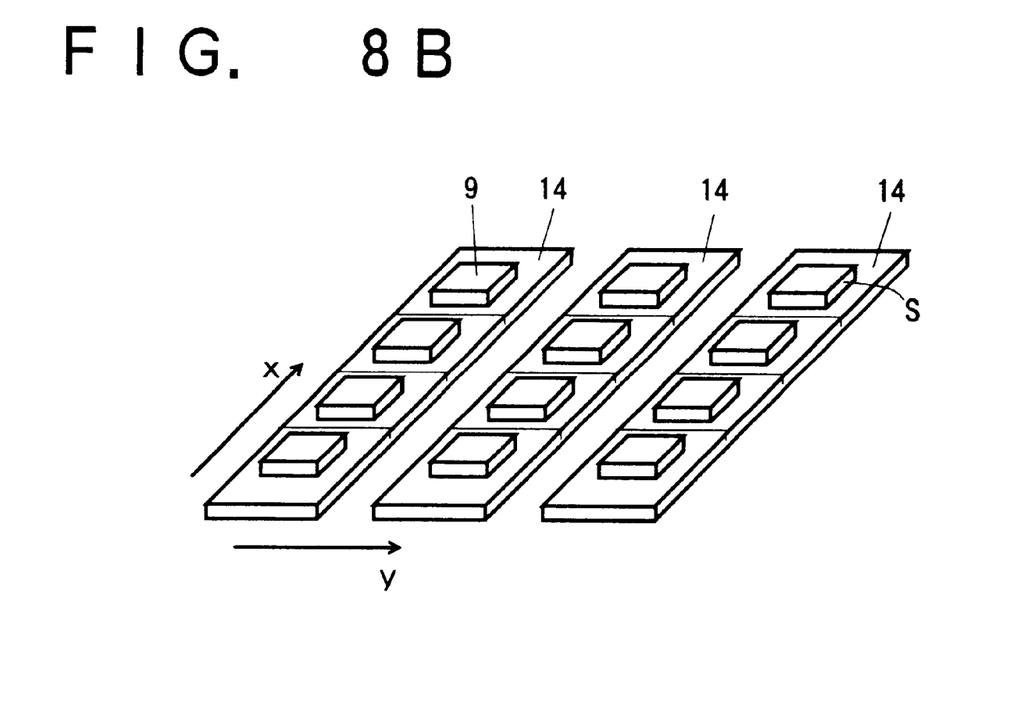

A wafer 10 treated with the above-mentioned process was treated with scribing parallel to the length of the cavity (the direction of axis y), and scribe grooves 15 were formed as shown in FIG. 8A. Then dicing the wafer 10 parallel to the facets S of the cavity (the direction of axis x), pieces of strip 14 were formed as shown in FIG. 8B.

Figure 8C:
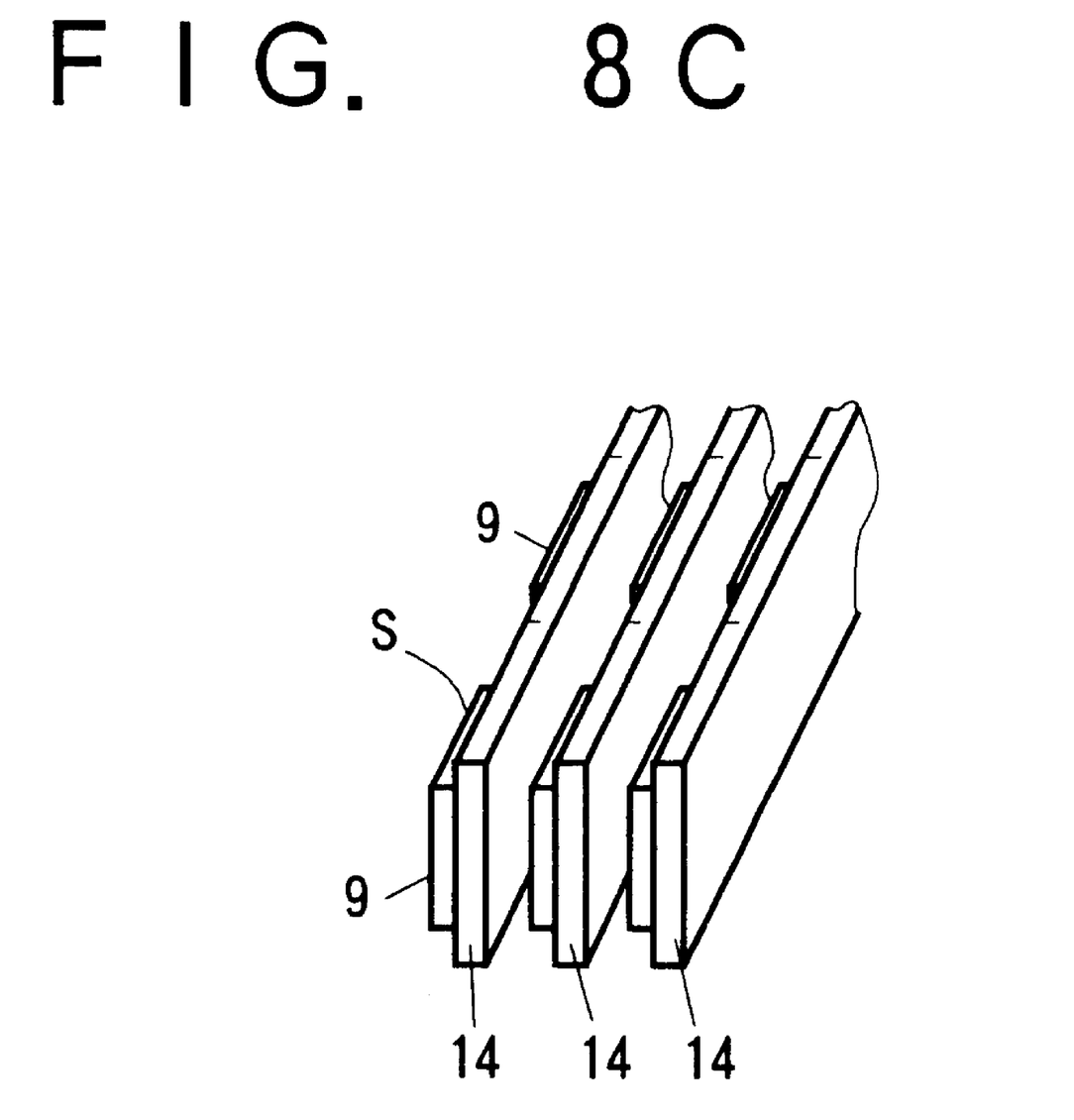

As shown in FIG. 8C, each of the strips 14 was disposed so that the facet S of either side of the cavity faced to upside, and the facet S was etched by gas cluster ion beam using argon (Ar) gas. Then the side of the strips 14 was reversed so that the opposite facet of the cavity faced to the upside, and the facet of the opposite side was etched by the same process. The etching condition was set at cluster size 3000, acceleration energy 20 KeV, ion dose quantity $1\times10^{16}$ IONS/cm$^3$. This etching by gas cluster beam enabled a magnitude of surface roughness of 200 Å the facets S to be reduced to equal or less than 20 Å, compared to the etching by RIBE.

Figure 7:
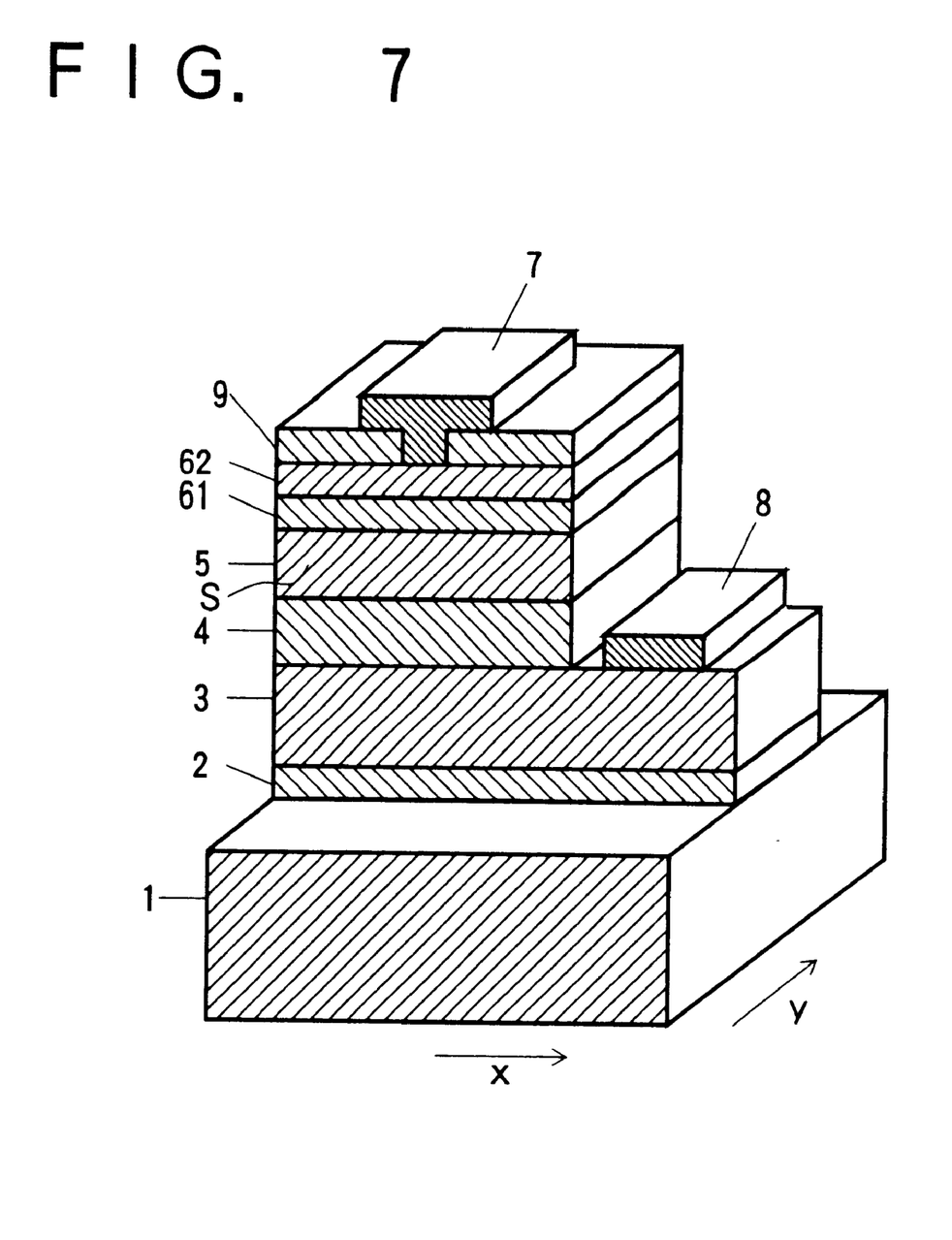
FIG. 7 is a perspective-sectional view illustrating the structure of the LD.

Then, SiO$_2$ was laminated by spattering to protect the both of the facets S of the cavity. The pieces of strip 14 were pressed by a roller and divided into pieces of chip by a scribe groove 15 formed parallel to axis y. As a result, the one pair of opposite facets S of the cavity, which had high verticality to the sapphire substrate 1, high parallelism, high flatness and high mirror reflection, was obtained as shown in FIG. 7. These characteristics of the facets S enabled to increase the effect of reflecting and confining lights, and to lower a threshold current density. Thus obtained LD 100 was found to have a drive current of 1000 mA, an output power of 10 mW, and an oscillation peek-wavelength of 380 nm.

In the embodiment, the guard film of SiO$_2$ was formed on the facets S of the cavity. Alternatively, a multiple layer made of a silicon oxide like SiO$_2$, a silicon nitride like Si$_3$N$_4$, and a dielectric like TiO$_2$ can be formed on the facets S of the cavity. Optimum thickness of each layers of the multiple layer enables the facets S to increase its reflection factor. The gas cluster ion beam etching used Ar gas. Alternatively, inert gases like helium (He), neon (Ne), krypton (Kr), xenon (Xe), radon (Rn), nitrogen (N$_2$), and carbon dioxide (CO$_2$), or reactive gases like hydrogen chloride (HCl), chlorine (Cl$_2$), carbon chloride trifluoride (CClF$_3$), bromine (Br), and hydrogen bromide (HBr) can be used to the gas cluster ion beam etching. Cl$_2$ was used for a reactive gas of RIBE. Alternatively, boron trichloride (BCl$_3$), silicon quadrichloride (SiCl$_4$), and carbon quadrichloride (CCl$_4$) can be used for RIBE. RIBE was used to the dry etching. Alternatively, reactive ion etching (RIE), or ion beam assist etching (IBAE) can be used to the dry etching.

The active layer 5, and the cladding layers 4 and 61 were formed satisfying the formulas Ga$_{0.92}$In$_{0.08}$N and Al$_{0.08}$Ga$_{0.92}$N. Alternatively, binary, ternary or quaternary Group III nitride compound semiconductor which satisfies the formula Al$_x$Ga$_y$In$_{1-x-y}$N ($0\leq x\leq1$, $0\leq y\leq1$, $0\leq x+y\leq1$) can be used to form the active layer 5, the cladding layers 4 and 61. When the active layer 5 and the cladding layers 4 and 61 form double hetero junction, a composition ratio of the layers should be chosen so that a band gap of the active layer 5 can be narrower than that of the cladding layers 4 and 61, and that the lattice constant can be matched with each other. When arbitrary quaternary Group III nitride compound semiconductor is used, double hetero junction which has accordant lattice constant of each layers can be formed because the band gap and the lattice constant can be varied independently. Although the active layer and the cladding layers are preferably formed by double hetero junction, the layers should not to be limited to double hetero junction. Alternatively, the layers can be formed by single hetero junction or homo junction, and the active layer can have a multi-quantum well structure (MQW) or single-quantum well structure (SQW).

SiO$_2$ was used to mask in the process of etching to form the electrode 8. Alternatively, metal or resist which is etchingproof against dry etching and has a selectivity of etching or easiness of peeling from layer formed by GaN based semiconductor can be used as a mask in the process of etching to form the electrode 8. A photoresist was used as a mask in the process of etching to form the facets S of the cavity. Alternatively, SiO$_2$ or other materials which is etchingproof against dry etching and has a selectivity of etching or easiness of peeling from the electrodes 7 and 8 and GaN based semiconductor.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method for manufacturing a laser diode using a Group III nitride semiconductor, the method comprising:

forming a plurality of layers each of which comprises a Group III nitride compound semiconductor having different components or composition ratios;

dry-etching said layers to form a pair of opposite and parallel facets of a cavity, thereby forming substantial surface roughness on said facets; and further etching said facets by gas cluster ion beam etching to substantially decrease said surface roughness formed on said facets by said dry-etching, said gas cluster ion beam etching being executed under a condition that a wafer is cut into strips parallel to said facets and said strips are disposed with said facets oriented in a direction that is substantially perpendicular to a direction of said gas cluster ion beam.

2. A method of claim 1, wherein said semiconductor satisfies the formula Al$_x$Ga$_y$In$_{1-x-y}$N ($0\leq x\leq1$, $0\leq y\leq1$, $0\leq x+y\leq1$).

3. A method of claim 1, wherein said dry-etching is a reactive ion beam etching (RIBE).

4. A method of claim 3, wherein said RIBE uses Cl$_2$ gas.

5. A method of claim 1, wherein said laser diode comprises a cladding layer which satisfies the formula Al$_{x1}$Ga$_{1-x1}$N($0\leq x1\leq1$)) and an active layer which satisfies the formula Ga$_{x2}$In$_{1-2}$N($0\leq x2\leq1$).

6. A method of claim 1, wherein said gas cluster ion beam etching uses inert gases like argon (Ar), helium (He), neon (Ne), krypton (Kr), xenon (Xe), radon (Rn), nitrogen (N$_2$), and carbon dioxide (CO$_2$).

7. A method of claim 1, wherein said gas cluster ion beam etching uses reactive gases like hydrogen chloride (HCl), chlorine (Cl$_2$), carbon chloride trifluoride (CCLF$_3$), bromine (Br$_2$), and hydrogen bromide (HBr).

8. A method as in claim 1, wherein said further etching includes reducing said surface roughness on said facets to less than or equal to 20 Å.

9. A method as in claim 1, further comprising forming a protective film on said facets etched by said gas cluster ion beam etching.

10. A method of claim 1, wherein said gas cluster ion beam etching is executed by irradiating said gas cluster ion beam perpendicular to said facets under the condition that a wafer is cut into pieces of strips in parallel to said facets and said strips are disposed with said facets upside.

11. A method as in claim 10, further comprising forming a protective film on said facets etched by said gas cluster ion beam etching.

12. A method as in claim 11, wherein said forming a protective film includes forming said protective film of at least one of a group of silicon oxide, silicon nitride, and dielectric.

13. A method as in claim 10, further comprising forming a protective film comprising at least one of a group of silicon oxide, silicon nitride, and dielectric.

14. A method as in claim 13, wherein said forming a protective film includes forming a multiple layer structure.

15. A method as in claim 13, wherein said forming a protective film includes forming a multiple layer structure.

* * * * *